United States Patent [19]

Brown

[11] 4,162,111
[45] Jul. 24, 1979

[54] PIEZOELECTRIC ULTRASONIC TRANSDUCER WITH DAMPED HOUSING

[75] Inventor: Alvin E. Brown, Claremont, Calif.

[73] Assignee: E. I. Du Pont de Nemours and Company, Wilmington, Del.

[21] Appl. No.: 827,599

[22] Filed: Aug. 25, 1977

[51] Int. Cl.² ............................................ H01L 41/10
[52] U.S. Cl. ...................................... 310/326; 310/336
[58] Field of Search ................................. 310/336, 326

[56] References Cited

U.S. PATENT DOCUMENTS

| 2,784,325 | 3/1957 | Halliday et al. | 310/336 |
| 3,745,829 | 7/1973 | Franchi | 310/336 X |
| 3,890,423 | 6/1975 | Zacharias, Jr. | 310/336 X |

*Primary Examiner*—Mark O. Budd

[57] ABSTRACT

A high temperature ultrasonic transducer is described in which a piezoelectric crystal is held in contact with an acoustical diaphragm by a spring which also electrically couples the back face of the crystal to an electrical signal source. An oil film between the diaphragm and crystal provides an acoustical coupling. Air is used to insulate the spring electrical connection from the wall of the transducer.

3 Claims, 3 Drawing Figures

PIEZOELECTRIC ULTRASONIC TRANSDUCER WITH DAMPED HOUSING

BACKGROUND OF THE INVENTION

This invention relates to ultrasonic transducers and, more particularly, to a high temperature ultrasonic transducer.

Ultrasonic flowmeters used to monitor fluids that will propagate sound pulses require a transducer that converts an electrical signal into an ultrasonic acoustical signal. The acoustical signal then is passed through the fluid. In a typical case these acoustical or sound signals are propagated alternately in opposite directions between transducers positioned in upstream-downstream relationship in the fluid flow channel. Because the upstream signal velocity is decreased and the downstream signal velocity is increased by the moving fluid, the alternating pulses yield a frequency or time difference. This time difference is an indication of average flow velocity in the flow channel.

Since the transducers themselves preferably are in intimate contact with the fluid and, in any event, in intimate contact with the pipe containing the fluid, problems are often encountered when the fluid is at a high temperature. At these high temperatures normal materials, epoxy and the like, which are used to position and mount the transducers and to electrically insulate the crystal from its protective housing often becomes softened or destroyed. The faces of a piezoelectric crystal transducer often are painted with a silver or similar electrically conductive paint, and the painted face soldered to an electrical connection by which electrical energy is supplied to the crystal. At high temperatures even these soldered connections tend to soften and become defective.

One transducer is known which is capable of operating under high temperature conditions. This transducer is described in U.S. Pat. No. 3,925,692 issued to Rescheck, et al. Unfortunately, this transducer requires optically flat surfaces to obtain the desired electrical and mechanical couplings. Such requirement renders these transducers relatively expensive to make.

A further problem is encountered in the prior art transducer housings in that unless properly damped, the housings tend to ring and produce unwanted ultrasonic signals in the fluid under test. These undesired signals can cause problems in the accurate measurement of fluid flow.

Accordingly, it is an object of this invention to provide an improved ultrasonic transducer that is capable of operating reliably in relatively high temperatures.

SUMMARY OF THE INVENTION

According to this invention an ultrasonic transducer is constructed of a piezoelectric crystal, having first and second opposite faces, an acoustically transparent diaphragm contacting said first crystal face, and a resilient member directly contacting said second crystal face for maintaining the crystal electrically and acoustically coupled to the diaphragm and for supplying an electrical signal to the crystal, and a housing for said crystal and said resilient member secured to said diaphragm.

In a preferred embodiment of the invention the crystal is held in a tubular housing with the diaphragm closing one end. The diaphragm has a ring-like bevel that positions the crystal on the diaphragm such that it is coaxially positioned within the housing. The resilient member which carries the electrical signal from say the connector pin of a coaxial connector is thus air insulated from the surrounding housing walls. Contrary to the prior art transducers, the cooperative roughness of the crystal face and diaphragm face is relied upon to provide the appropriate electrical contact with the crystal. To improve acoustical coupling, a liquid film is placed between the diaphragm and the abutting crystal face. The entire housing, preferably, is hermetically sealed to prevent the evaporation, oxidation, or hardening of the liquid.

BRIEF DESCRIPTION OF THE DRAWINGS

Further advantages and features of this invention will become apparent upon consideration of the following description wherein.

DETAILED DESCRIPTION OF THE PREFERRED EMBODIMENTS

Figure 1:
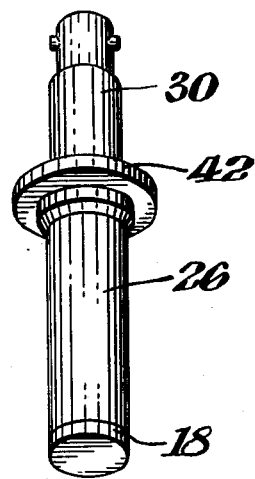
FIG. 1 is a pictorial view of a high temperature transducer constructed in accordance with this invention.
Figure 2:
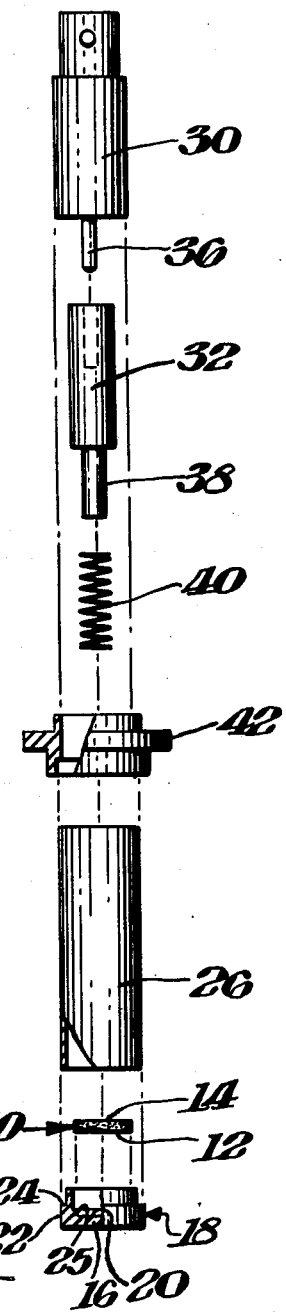
FIG. 2 is an exploded view of the transducer depicted in FIG. 1.
Figure 3:
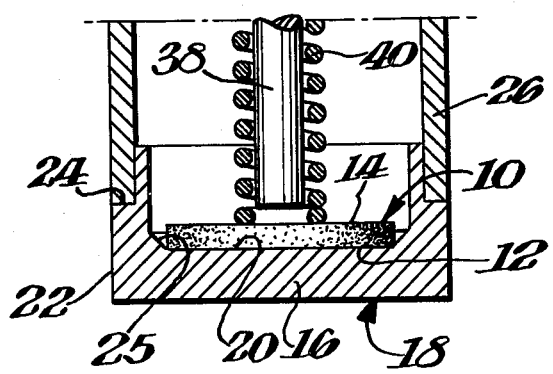
FIG. 3 is a fragmentary, partially cutaway, elevation view of the lower portion of the transducer illustrated in FIG. 1.

A high temperature ultrasonic transducer is constructed in accordance with this invention by selecting a flat, piezoelectric crystal 10 of a material conventionally used in ultrasonic transducers such as lead zirconate-lead titanate (PZT). Other known piezoelectric materials that may be used include bismuthstrontium-titanate, lithium niobate, lead methaniobate, and others. The flat crystal 10, which is disc-like, has a pair of opposite faces 12 and 14. The crystal is placed with one face 12 contacting the end face or diaphragm 16 of an end cap 18. The diaphragm provides an acoustical window for transmitting the sound waves into the fluid. Both faces 12 and 14 of the crystal are coated or painted with an electrically conductive paint such as a silver paint or other suitable electrically conductive material. The inside face 20 of the diaphragm 16 is generally flat and at its periphery, has a beveled ring-like protuberance so as to properly center the crystal disc 10 on the diaphragm 16 such that the peripheral edges of the disc 10 do not contact the side walls of the end cap 18. This leaves a small annular space of air for electrical insulation. The diaphragm 16 has a thickness typically corresponding to one-half of the wave length of the frequency to be generated by the transducer or any integral multiple thereof to avoid standing waves.

The faces of the painted crystal 10 are inherently rough. It is this roughness that is relied upon to provide the proper electrical coupling to the the end cap 18 to receive an electrical signal for energizing the crystal. To aid the acoustical coupling between the crystal face 14 and the diaphragm 16, a thin film of oil such as a high temperature diffusion pump oil (Sanzovac 5 manufactured by Monsanto) may be used.

Alternatively, many liquids capable of withstanding high temperatures may also be used. These include silicone oil.

To complete the description of the end cap 18, it is provided with an axially extending (tubular) damping rim 22 which is integral therewith such that the end cap is a unitary piece. The outer periphery has a step portion 24 so that it may be adapted to be inserted into a tubular housing 26. The tubular housing, preferably, may be welded to the end cap 18 to provide an appropriate hermetic seal. The step 24 may be formed internally if desired to cooperate with an external step in the housing, but this construction is somewhat more expensive and hence is not preferred.

The axial length of the damping rim 22 should be relatively short and the location of the step 24 should be either approximately at or just above the point at which the crystal face 12 contacts the inside face 20 of the diaphragm 16. This acoustically damps, by mass loading, vibrations and other ringing which typically occurs in the tubular housing. The axial length of the rim 22 may be considerably longer but its ability to dampen decreases as its length increases. At four times the wavelength λ of the frequency generated by the crystal, (4λ) for example, ringing generally occurs. The most effective damping has been found to occur when the step 24 is approximately at the plane of the inside face 20.

Further, in accordance with this invention, to complete the transducer assembly, a conventional hermetically sealed coaxial connector 30 having an electrically insulated pin 36 is secured in or to the open end of the tubular housing 26. This permits, when the tubular housing 26 is hermetically sealed as by welding at one end to the end cap 18 and at the other end to the connector 30, a hermetically sealed interior. Prior to sealing the transducer may be evacuated and, if desired, filled with an inert gas. This prevents drying and oxidation of the oil and improves the ability of the transducer to operate at high temperatures. Before closing the transducer assembly, however, a spring guide 32, which can be made of brass or other suitable electrically conductive material, has one end bored so that it may be fitted onto the pin 36. For mechanical mounting and electrical continuity, the other end of the spring guide 32 is formed with a stud 38 of reduced diameter so that it may accomodate a resilient member, such as a spring 40. The spring, preferably, may be made out of any electrically conductive material such as Inconel, an alloy, capable of withstanding high temperatures without appreciably increasing its electrical resistance and yet retaining its resilience. The length of the spring 40 is longer than that of the stud 38 such that when the transducer is assembled, the spring bears against the outside face 14 of the crystal disc 10. This maintains the disc in good contact, acoustical and electrical, with the diaphragm 16.

Preferably, a flanged coupling 42 is used between the housing 26 and the coaxial connector 30 as illustrated. The coupling is disc-like and has central bores 43. Both the connector 30 and the housing 26 fit within recesses formed coaxially within the central bore 43 in opposite faces of the coupling. The recesses in both faces of the coupling 42 are welded respectively to the housing 26 and to the coaxial connector 30 to complete the hermetically sealed enclosure. Desirably, the wall thickness of the housing 26 is such that the internal diameter of the housing is less than the outside diameter of the connector 30. This properly seats the connector 30 in the coupling. Other similar arrangements may be made.

Within the enclosure it is noted that the electrical connection to the other face 14 of the crystal is through the pin 36, the spring guide 32 and the spring 40. The spring is electrically insulated from the housing 26 by physical separation therefrom, the crystal disc 10 being centrally positioned by the bevel 25 to maintain a coaxial relationship with an air spacing between the internal electrical connection and the tubular housing. Of course, the second electrical connection to the crystal is provided by the housing and end cap. Because of the hermetic seal, the oil has little or no tendency to dry out, oxidize, or evaporate, hence it is relatively long-lived in its functionability. There are no parts within the transducer that are appreciably affected by high temperatures. Hence the temperatures to which the transducer may be exposed is limited only by the ability of the crystal itself, and the oil if used, to withstand such temperatures. Finally, the rim of the end cap 18 damps unwanted ringing in the tube housing itself. The transducer is easily and quickly assembled—a high degree of precision not being required during manufacture of the parts. No elaborate or expensive insulating materials are required—space, gas, or vacuum being used to provide the electrical insulation.

It is thus seen that the transducer assembly is relatively economical in construction and yet operates effectively and efficiently even under relatively high temperature conditions.

I claim:

1. An ultrasonic transducer comprising:
   an electrical coaxial connector having an electrically insulated pin,
   an acoustically transparent diaphragm,
   a tubular housing interconnecting said diaphragm and said connector, said housing having a tube axis, said diaphragm having a face internal of said housing,
   a flat piezoelectric crystal having one face in contact with said diaphragm, and
   a compression spring in compression between said connector pin and another face of said crystal for electrically and acoustically coupling said crystal to said diaphragm internal face and electrically coupling said connector pin to said another crystal face, said diaphragm defining a protuberant peripheral internal face bevel for centering said crystal thereon for electrically insulating the other face of said crystal from said housing, an elongated spring guide having an axis, an axial bore fitted on said connector pin, and an axial stud for guiding said spring, said diaphragm being unitary and defining a tubular rim coaxial with and secured to said housing for damping unwanted vibrations in said housing, said rim having an axial length less than four times the wavelength of sound therein at the operating frequency of said crystal.

2. An ultrasonic transducer comprising:
   an electrical coaxial connector having an electrically insulated pin,
   an acoustically transparent diaphragm,
   a tubular housing interconnecting said diaphragm and said connector, said housing having a tube axis, said diaphragm having a face internal of said housing,
   a flat piezoelectric crystal having one face in contact with said diaphragm, and
   a resilient member in compression between said connector pin and another face of said crystal for electrically and acoustically coupling said crystal to said diaphragm internal face and electrically coupling said connector pin to said another crystal face, said diaphragm defining a protuberant peripheral internal face bevel for centering said crystal thereon for electrically insulating the other face of said crystal from said housing, said diaphragm being unitary and defining a tubular rim coaxial with and secured to said housing for damping unwanted vibrations in said housing, said rim having a stepped portion of reduced diameter located about in the plane of said another crystal face.

3. An ultrasonic transducer comprising:

an electrical coaxial connector having an electrically insulated pin, an acoustically transparent diaphragm, a tubular housing interconnecting said diaphragm and said connector, said housing having a tube axis, said diaphragm having a face internal of said housing, a flat piezoelectric crystal having one face in contact with said diaphragm, and a resilient member in compression between said connector pin and another face of said crystal for electrically and acoustically coupling said crystal to said diaphragm internal face and electrically coupling said connector pin to said another crystal face, said diahragm defining a protuberant peripheral internal face bevel for centering said crystal thereon for electrically insulating the other face of said crystal from said housing, said diaphragm being unitary and defining a tubular rim coaxial with and secured to said housing for damping unwanted vibrations in said housing, said rim having an axial length less than four times the wavelength of sound therein at the operating frequency of said crystal.

* * * * *